(12) United States Patent
Dunn et al.

(10) Patent No.: US 9,285,108 B2
(45) Date of Patent: Mar. 15, 2016

(54) EXPANDED HEAT SINK FOR ELECTRONIC DISPLAYS

(71) Applicant: Manufacturing Resources International, Inc., Alpharetta, GA (US)

(72) Inventors: William Dunn, Alpharetta, GA (US); Ware Bedell, Cummings, GA (US); Tim Hubbard, Alpharetta, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 0 days.

(21) Appl. No.: 14/326,053

(22) Filed: Jul. 8, 2014

(65) Prior Publication Data

US 2014/0321103 A1    Oct. 30, 2014

Related U.S. Application Data

(63) Continuation of application No. 12/905,704, filed on Oct. 15, 2010, now Pat. No. 8,773,633, which is a continuation-in-part of application No. 12/641,468, filed on Dec. 18, 2009, now Pat. No. 8,654,302, and a continuation-in-part of application No. 12/411,925, filed on Mar. 26, 2009, now Pat. No. 8,854,595, and a continuation-in-part of application No. 12/556,029, filed on Sep. 9, 2009, now Pat. No. 8,373,841, and a continuation-in-part of application No. 12/556,209, filed on Sep. 9, 2009, now Pat. No. 8,379,182, and a continuation-in-part of application No. 12/234,307, filed on Sep. 19, 2008, now Pat. No. 8,767,165, and a continuation-in-part of application No. 12/234,360, filed on Sep. 19, 2008, and a (Continued)

(51) Int. Cl.
*G02F 1/1333* (2006.01)
*G09F 13/04* (2006.01)
*G09F 13/08* (2006.01)
*F21V 29/00* (2015.01)
*F21V 29/67* (2015.01)
*F21V 29/83* (2015.01)
*G02F 1/1335* (2006.01)

(52) U.S. Cl.
CPC ........... *F21V 29/2293* (2013.01); *F21V 29/673* (2015.01); *F21V 29/83* (2015.01); *G02F 1/133308* (2013.01); *G02F 1/133603* (2013.01); *G02F 2001/13332* (2013.01); *G02F 2001/133628* (2013.01); *G02F 2201/36* (2013.01)

(58) Field of Classification Search
CPC .................... G02F 1/133308; G02F 1/133603; F21V 29/2293; F21V 29/673; F21V 29/83
USPC ..................... 349/161; 361/679.21, 694, 695; 362/373

See application file for complete search history.

(56) References Cited

U.S. PATENT DOCUMENTS

| | | | |
|---|---|---|---|
| 6,683,639 B2 * | 1/2004 | Driessen-Olde Scheper et al. | 347/238 |
| 2006/0262079 A1 * | 11/2006 | Seong et al. | 345/102 |

*Primary Examiner* — Jerry Blevins
(74) *Attorney, Agent, or Firm* — Standley Law Group LLP

(57) ABSTRACT

A system for cooling various components of an electronic display. One or more heat-generating components are preferably placed in thermal communication with a plate and ribs. One or more fans are placed to draw cooling air along the ribs to remove the heat removed from the component. Some embodiments may place the electronic image assembly in thermal communication with the ribs to remove heat from the electronic image assembly. Exemplary embodiments have power modules and the electronic image assembly in thermal communication with the ribs. Conductive thermal communication is established between the ribs and the components in the exemplary embodiments.

20 Claims, 6 Drawing Sheets

Related U.S. Application Data continuation-in-part of application No. 12/237,365, filed on Sep. 24, 2008, now Pat. No. 8,879,042, and a continuation-in-part of application No. 12/235,200, filed on Sep. 22, 2008, and a continuation-in-part of application No. 12/620,330, filed on Nov. 17, 2009, now Pat. No. 8,274,622, and a continuation-in-part of application No. 12/706,652, filed on Feb. 16, 2010, now Pat. No. 8,358,397, and a continuation-in-part of application No. 12/630,469, filed on Dec. 3, 2009, now Pat. No. 8,497,972, and a continuation-in-part of application No. 12/618,104, filed on Nov. 13, 2009, now Pat. No. 8,310,824.

(60) Provisional application No. 61/252,295, filed on Oct. 16, 2009, provisional application No. 61/138,736, filed on Dec. 18, 2008, provisional application No. 61/039,454, filed on Mar. 26, 2008, provisional application No. 61/095,615, filed on Sep. 9, 2008, provisional application No. 61/095,616, filed on Sep. 9, 2008, provisional application No. 61/033,064, filed on Mar. 3, 2008, provisional application No. 61/053,713, filed on May 16, 2008, provisional application No. 61/057,599, filed on May 30, 2008, provisional application No. 61/076,126, filed on Jun. 26, 2008, provisional application No. 61/115,333, filed on Nov. 17, 2008, provisional application No. 61/152,879, filed on Feb. 16, 2009.

EXPANDED HEAT SINK FOR ELECTRONIC DISPLAYS

CROSS-REFERENCE TO RELATED APPLICATIONS

This application is a continuation of U.S. application Ser. No. 12/905,704 filed on Oct. 15, 2010, now U.S. Pat. No. 8,773,633, issued Jul. 8, 2014. U.S. application Ser. No. 12/905,704 is a non-provisional of U.S. application Ser. No. 61/252,295 filed Oct. 16, 2009. U.S. application Ser. No. 12/905,704 is also a continuation in part of U.S. application Ser. No. 12/641,468 filed Dec. 18, 2009, now U.S. Pat. No. 8,654,302 issued Feb. 18, 2014 which is a non-provisional of U.S. application Ser. No. 61/138,736 filed Dec. 18, 2008. U.S. application Ser. No. 12/905,704 is also a continuation in part of U.S. application Ser. No. 12/411,925 filed Mar. 26, 2009, which is a non-provisional of U.S. application Ser. No. 61/039,454 filed Mar. 26, 2008. U.S. application Ser. No. 12/905,704 is also a continuation-in-part of U.S. application Ser. No. 12/556,029 filed Sep. 9, 2009, now U.S. Pat. No. 8,373,841 issued Feb. 12, 2013, which is a non-provisional application of U.S. provisional application 61/095,615 filed Sep. 9, 2008. U.S. application Ser. No. 12/905,704 is also a continuation in part of U.S. application Ser. No. 12/556,209 filed Sep. 9, 2009, now U.S. Pat. No. 8,379,182 issued Feb. 19, 2013, which is a non-provisional of U.S. application Ser. No. 61/095,616 filed Sep. 9, 2008. U.S. application Ser. No. 12/905,704 is also a continuation in part of U.S. application Ser. No. 12/234,307 filed Sep. 18, 2008, now U.S. Pat. No. 8,767,165 issued Jul. 1, 2014, which is a non-provisional of U.S. application Ser. No. 61/033,064 filed Mar. 3, 2008. U.S. application Ser. No. 12/905,704 is also a continuation-in-part of U.S. application Ser. No. 12/234,360 filed Sep. 19, 2008, which is a non-provisional application of U.S. provisional application 61/053,713 filed May 16, 2008. U.S. application Ser. No. 12/905,704 is also a continuation-in-part of U.S. application Ser. No. 12/237,365 filed Sep. 24, 2008, which is a non-provisional application of U.S. provisional application 61/057,599 filed May 30, 2008. U.S. application Ser. No. 12/905,704 is also a continuation-in-part of U.S. application Ser. No. 12/235,200 filed Sep. 22, 2008, which is a non-provisional application of U.S. provisional application 61/076,126 filed Jun. 26, 2008. U.S. application Ser. No. 12/905,704 is also a continuation-in-part of U.S. application Ser. No. 12/620,330 filed Nov. 17, 2009, now U.S. Pat. No. 8,274,622 issued Sep. 25, 2012, which is a non-provisional application of U.S. provisional application 61/115,333 filed Nov. 17, 2008. U.S. application Ser. No. 12/905,704 is also a continuation-in-part of U.S. application Ser. No. 12/706,652 filed Feb. 16, 2010, now U.S. Pat. No. 8,358,397 issued Jan. 22, 2013, which is a non-provisional application of U.S. provisional application 61/152,879 filed Feb. 16, 2009. U.S. application Ser. No. 12/905,704 is also a continuation-in-part of U.S. application Ser. No. 12/630,469 filed Dec. 3, 2009, now U.S. Pat. No. 8,497,972 issued Jul. 30, 2013. U.S. application Ser. No. 12/905,704 is also a continuation-in-part of U.S. application Ser. No. 12/618,104 filed Nov. 13, 2009, now U.S. Pat. No. 8,310,824 issued Nov. 13, 2013. All aforementioned applications are hereby incorporated by reference in their entirety as if fully cited herein.

TECHNICAL FIELD

Exemplary embodiments generally relate to cooling systems and in particular to cooling systems for electronic displays.

BACKGROUND OF THE ART

Heat transfer systems for electronic displays generally attempt to remove heat from the heat-generating electronic components through as many sidewalls of the display as possible. In order to do this, some systems of the past have relied primarily on fans for moving air past the components to be cooled and out of the display. Components which are known for producing a large amount of heat may have a 'heat sink' attached to the component which provides an expanded surface area so that heat may be transferred away from the component. However, these heat sinks are traditionally attached to the component itself and are limited by the size and shape of the component itself. While such heat transfer systems have enjoyed a measure of success in the past, improvements to displays require even greater cooling capabilities.

Modern displays have become extremely bright, with some backlights producing 1,000-2,000 nits or more. Sometimes, these illumination levels are necessary because the display is being used outdoors, or in other relatively bright areas where the display illumination must compete with other ambient light. In order to produce this level of brightness, illumination devices (ex. LED, organic LED, light emitting polymer (LEP), organic electro luminescence (OEL), and plasma assemblies) may produce a relatively large amount of heat. Further, the illumination devices require a relatively large amount of power in order to generate the required brightness level. This large amount of power is typically supplied through one or more power supplies/modules for the display. These power supplies may also become a significant source of heat for the display.

Further, displays of the past were primarily designed for operation near room temperature. However, it is now desirable to have displays which are capable of withstanding large surrounding environmental temperature variations. For example, some displays may be designed to operate at temperatures as low as −22 F and as high as 113 F or higher. When surrounding temperatures rise, the cooling of the internal display components can become even more difficult.

Still further, in some situations radiative heat transfer from the sun through a front display surface can also become a source of heat. In some locations 200 Watts or more through such a front display surface is common. Furthermore, the market is demanding larger screen sizes for displays. With increased electronic display screen size and corresponding front display surfaces, more heat will be generated and more heat will be transmitted into the displays.

SUMMARY OF THE EXEMPLARY EMBODIMENTS

Exemplary embodiments relate to a system for cooling the various heat-producing components of an electronic display. The various embodiments herein provide a cooling system for transferring heat away from power module(s), central processing units (CPU), hard drives, backlights, and electronic image assemblies, either alone or in combination. One or more of the heat-producing components are preferably in thermal communication with a plurality of thermally conductive ribs where the ribs are placed in the path of cooling air. The heat from the heat-producing components is preferably transferred to and distributed throughout the ribs and removed by the cooling air.

In at least one embodiment, power modules and a display backlight may be placed in thermal communication with the ribs. In this way, a single path of cooling air can be used to cool two of the most heat-producing components of a typical electronic display (for this embodiment, an LCD display). For example, and not by way of limitation, LED arrays are commonly used as the illumination devices for LCD displays. It has been found that the optical properties of LEDs (and other illumination devices) can vary depending on temperature. Thus, when an LED is exposed to room temperatures, it may output light with a certain luminance, wavelength, and/or color temperature. However, when the same LED is exposed to high temperatures, the luminance, wavelength, color temperature, and other properties can vary. Thus, when a temperature variation occurs across an LED backlight (some areas are at a higher temperature than others) there can be optical inconsistencies across the backlight which can be visible to the observer. By using the embodiments herein, heat buildup can be evenly distributed across the thermally conductive ribs and removed from the display. This can prevent any potential 'hot spots' in the backlight which may become visible to the observer because of a change in optical properties of the illumination devices (sometimes LEDs).

The ribs may provide an isolated chamber from the rest of the display so that ambient air can be ingested and used to cool the ribs. This is beneficial for situations where the display is being used in an outdoor environment and the ingested air may contain contaminates (pollen, dirt, dust, water, smoke, etc.) that would damage the sensitive electronic components of the display.

If a backlight is used with the particular display application, a backlight with front and rear sides may be used where the front side contains the illumination devices and the rear side contains a thermally conductive surface for dissipating the heat from the illumination devices. The thermally conductive rear surface may be in thermal communication with the ribs so that heat from the backlight can be transferred to the ribs and out of the display. Ideally, there should be a low level of thermal resistance between the front and rear sides of the backlight. An exemplary embodiment may utilize a metal core PCB with LEDs on the front side and a metallic surface on the rear side.

Exemplary embodiments may include an additional closed loop of circulating gas which may travel across the front of the electronic image assembly, through a heat exchanger, and return to the front of the electronic image assembly. An inlet aperture which accepts cooling gas for the ribs can also accept cooling gas which may travel through the heat exchanger in order to cool the circulating gas.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

As used herein, the term 'thermally conductive' means any material having a thermal conductivity (K) greater than 2 Watts per Kelvin per meter (W/Km). Preferably, elements described herein as being 'thermally conductive' are comprised of metal, but this is not required. Even more preferably, elements described herein as being 'thermally conductive' are aluminum or some alloy of aluminum, but this also is not required. Further, as used herein 'thermal communication' may be conductive, convective, radiative, or any combination thereof.

Figure 1:
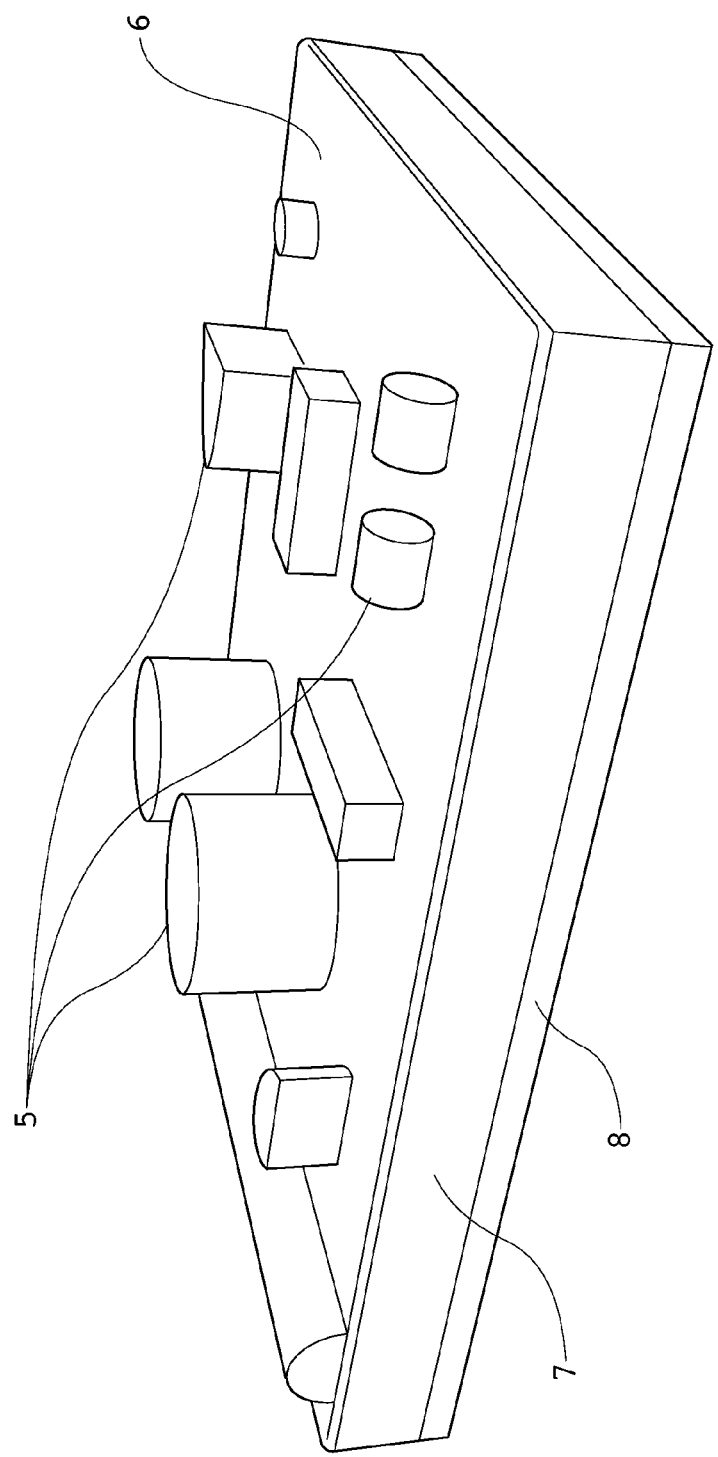
FIG. 1 is a perspective view of a typical power module.

FIG. 1 shows an embodiment of a typical power module 7 which may be used with some exemplary embodiments. A printed circuit board 6 may be attached to the power module 7 and may contain a plurality of electronic components 5 which may be necessary to operate and control the power module 7. These electronic components 5 may include, but are no means limited to resistors, capacitors, op-amps, wire harnesses, connectors, and inductors. An optional baseplate 8 may be attached to the power module 7 and may act as a heat dissipating assembly for the power module 7, such that heat which is generated by the power module 7 is transferred to the baseplate 8. In some embodiments there may be more components used, such as a conductive pad located between the power module and the baseplate 8.

Many types of power modules may be used with the embodiments described herein. A preferable power module would be any type which uses heat dissipating assemblies. An exemplary power module is commercially available from TDK-Lambda of San Diego, Calif. www.lambdapower.com. Specifically, the PFE series of power modules could be used with exemplary embodiments.

Figure 2:
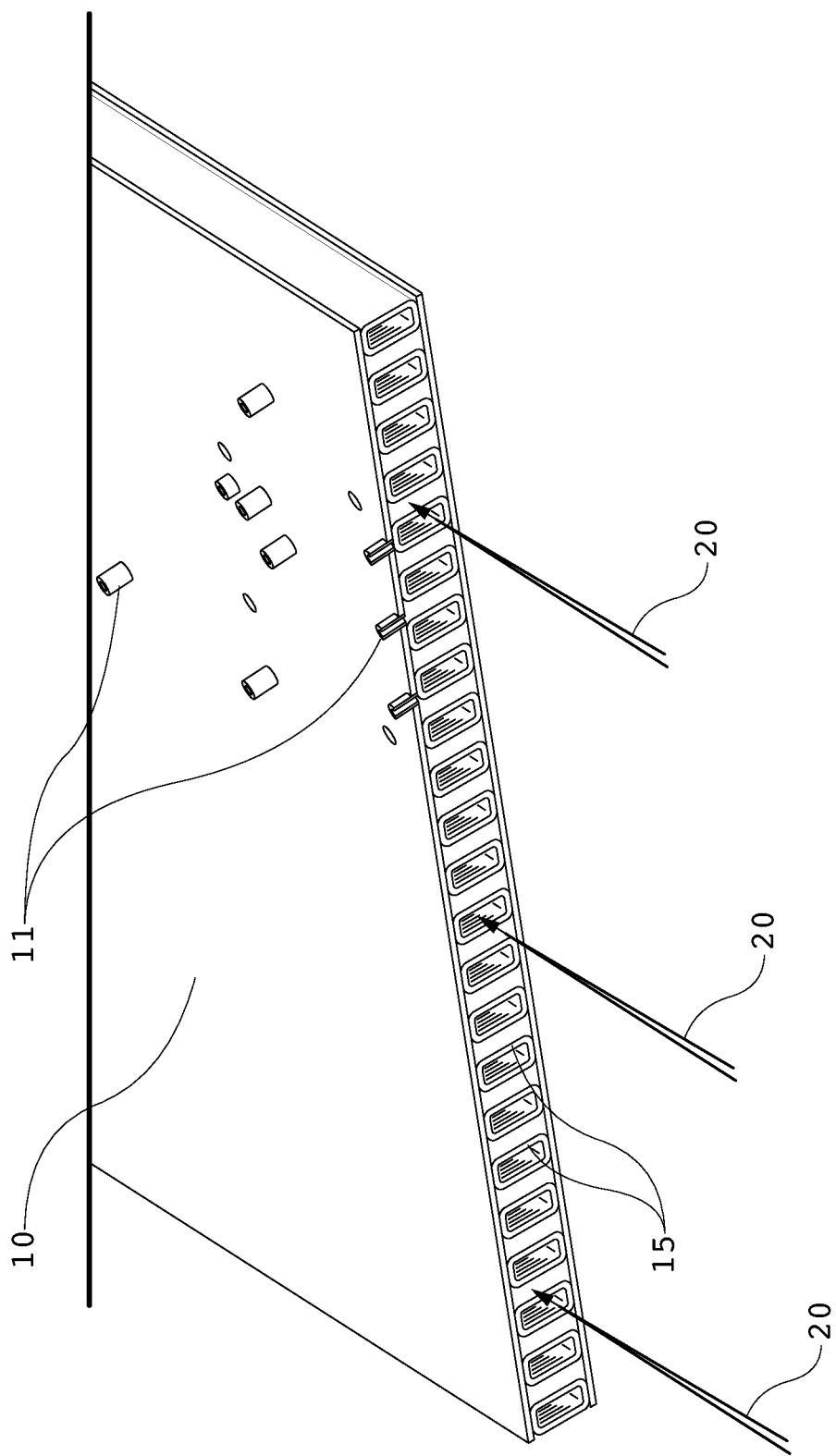
FIG. 2 is a perspective section view of an exemplary thermally conductive plate and ribs.

FIG. 2 provides a perspective section view of an exemplary thermally conductive plate 10 and thermally conductive ribs 15. Preferably, heat is permitted to transfer from the plate 10 to the ribs 15 through thermal communication (conductive, convective, radiative, or any combination). In one embodiment, the baseplate 8 of the power module would be placed in thermal communication with the thermally conductive plate 10. In other embodiments, a baseplate 8 may not be used and instead, the power module 7 would be in direct thermal communication with the thermally conductive plate 10. Due to the thermally conductive nature of the plate 10 and ribs 15 and the thermal communication between them, heat which is produced by the power modules may be distributed throughout the plate 10 and ribs 15. In an exemplary embodiment, a path of cooling air 20 is generated to remove the heat which has accumulated on the plate 10 and ribs 15. Alternatively, a natural convection process could also be used to allow the heat to escape the plate 10 and ribs 15 without using fans or forced convection.

A plurality of mounting posts 11 may be used to mount other heat-producing components such as PCBs, hard drives, timing and control boards, inductors, and even the power modules if desired. The mounting posts 11 may also be thermally conductive so that the heat which is generated by these components can also be transferred to the plate 10 and the ribs 15 and removed by the cooling air 20. The heat-producing components may also be placed directly on the thermally conductive plate 10 without using the posts 11.

In an exemplary embodiment, the plate 10 would provide a gaseous and contaminate barrier between the side containing the ribs 15 and the side containing the mounting posts 11, power modules, and any other electronic assemblies. If the plate 10 provides an adequate barrier, ambient air may be ingested as cooling air 20 and the risk of contaminates entering the side of the plate 10 containing the sensitive electronic components may be reduced or eliminated.

The ribs 15 shown in this embodiment contain a hollow rectangular cross-section, but this is not required. Other embodiments may contain ribs with I-beam cross-sections, hollow square cross-sections, solid rectangular or solid square cross-sections, 'T' cross-sections, 'Z' cross-sections, a honeycomb cross-section, or any combination or mixture of these. With any of the embodiments shown herein, the ribs may be fixed to the surrounding surfaces in a number of ways including but not limited to: adhesives, double-sided tape, mechanical fasteners, and welding. An exemplary embodiment may use a thermally-conductive silicone or adhesive. Other exemplary embodiments may use a thermally conductive very high bond (VHB) tape. In some embodiments, the ribs may not be separate elements but may be cast along with one of the surrounding surfaces or plates.

Figure 3:
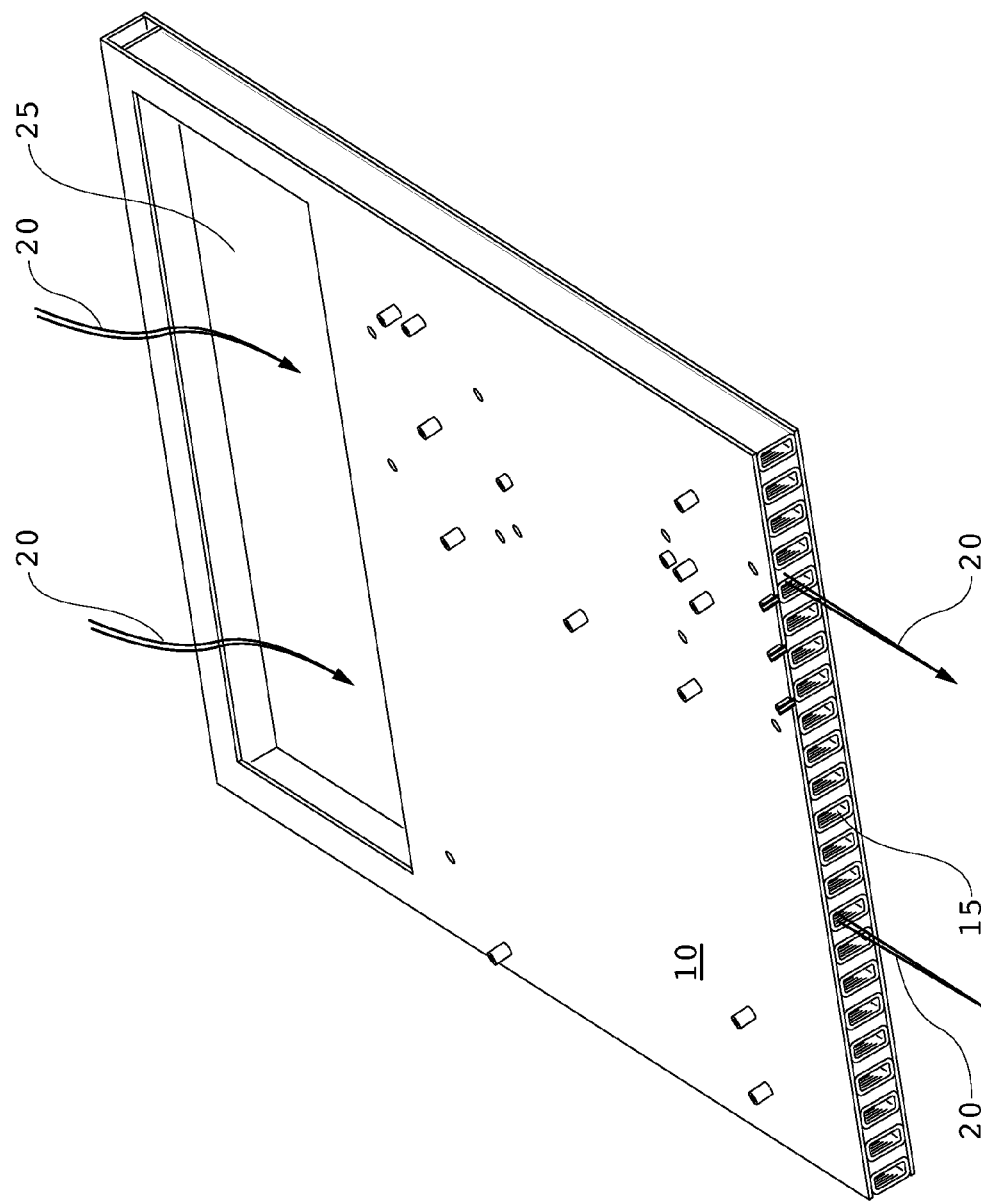
FIG. 3 is a perspective section view of an exemplary thermally conductive plate, ribs, and inlet aperture.

FIG. 3 provides one example of an inlet aperture 25 which accepts the cooling air 20 and directs it along the ribs 15.

Figure 4:
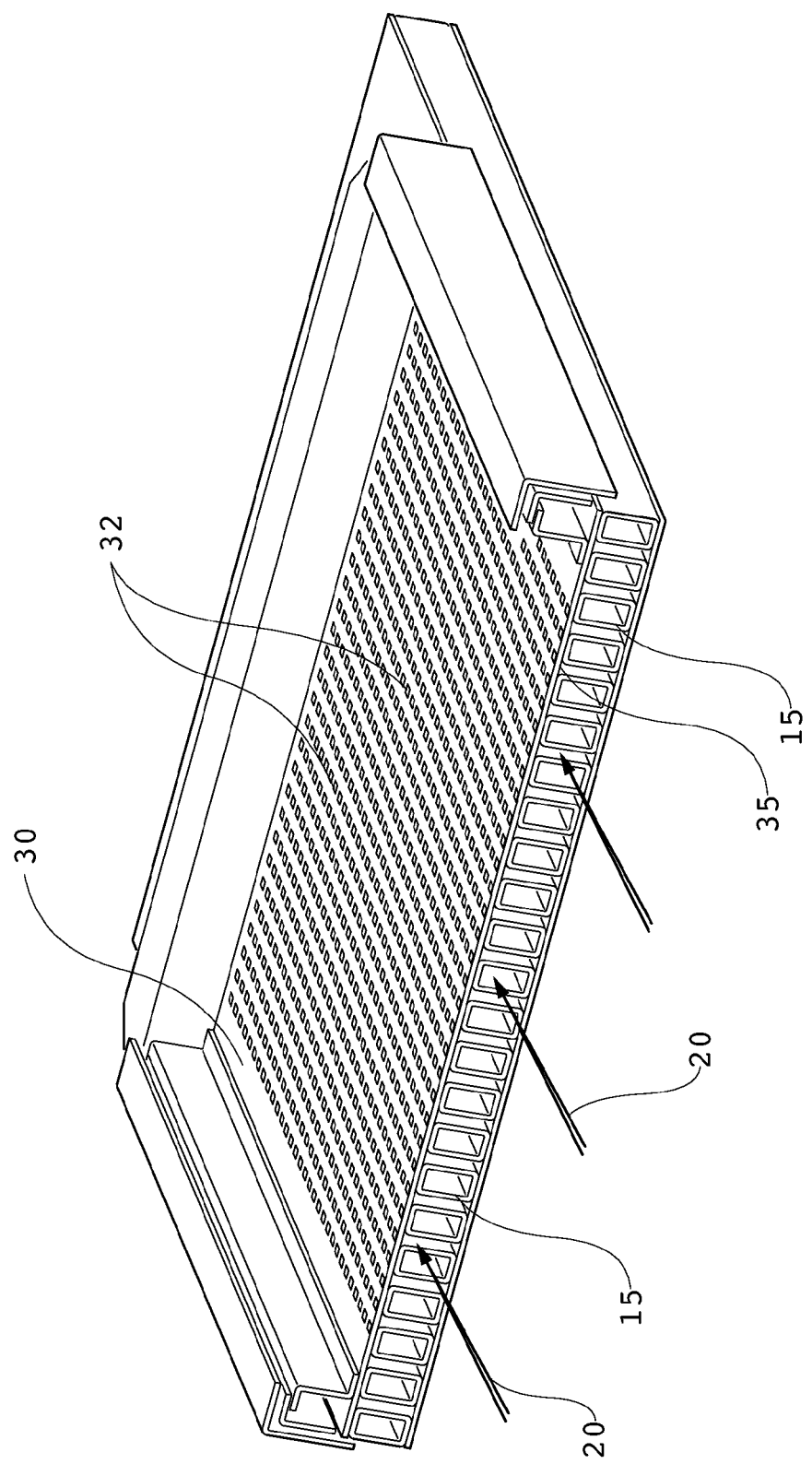
FIG. 4 is a perspective section view of an embodiment where the ribs are used to distribute heat from and cool a backlight assembly.

FIG. 4 provides a perspective section view of an embodiment where the ribs 15 are used to distribute heat from and cool a backlight assembly. The backlight assembly in this embodiment includes a plurality of illumination devices 32 which are mounted on a substrate 30. Preferably, the substrate 30 is thermally conductive. In an exemplary embodiment, the illumination devices 32 would preferably be LEDs and the substrate 30 would be a thermally conductive PCB and more preferably a metal core PCB. On the surface of the substrate 30 which faces the ribs 15 there may be a thermally conductive surface 35. In an exemplary embodiment, the thermally conductive surface 35 would be metallic and more preferably aluminum, but any thermally conductive material would suffice. It is preferred that the ribs 15 are in thermal communication with the rear surface 35 and that the rear surface 35 is in thermal communication with the (preferably thermally conductive) substrate 30. In some embodiments however, the substrate 30 may comprise traditional PCB materials rather than a metal core PCB or any highly thermally conductive materials. It is most preferable that there is a low level of thermal resistance between the illumination devices 32 and the ribs 15. Cooling air 20 may again be forced along the ribs 15 in order to remove heat from the backlight assembly. Of course, this could also occur through natural convection, but more efficient cooling has been typically observed through forced convection.

Of course, the mounting substrate 30 and illumination devices 32 can be any other type of device which illuminates, including but not limited to OLED, plasma display assembly, light emitting polymer (LEP) assembly, organic electro luminescence (OEL) assembly. Simply providing the rear surface 35 in thermal communication with any of these devices can allow the ribs to cool a variety of different types of electronic displays.

As noted above, many illumination devices may have optical performance properties which vary depending on temperature. When 'hot spots' are present within an illumination device, these hot spots can result in irregularities in the resulting image which might be visible to the end user. Thus, with the embodiments described herein, the heat which may be generated by the illumination device can be distributed throughout the various ribs and thermally conductive surfaces to remove hot spots and cool the illumination device. As is well known in the art, LEDs are typically used as a backlight for a liquid crystal assembly while OLEDs provide both the illumination and the color sub-elements (ex. pixels) necessary to produce an image. The embodiments shown can be used with LCD or OLED displays.

In an exemplary embodiment, the ribs 15 may be used to cool both the backlight assembly and the power modules. In a further exemplary embodiment, the ribs 15 can also be used to cool additional electronic assemblies by placing them in thermal communication with the thermally conductive plate 10. Thus, with the ribs 15 in a central location, the 'front' would be towards an intended observer of the display while the 'back' would be on the opposite side of an intended observer. Therefore, the front side of the ribs 15 would be in thermal communication with a backlight assembly, illumination device, or electronic image assembly and the rear side of the ribs would be in thermal communication with a rear plate (i.e. thermally conductive plate 10). A single path of cooling air can then be used to cool the interior of the display while the various hot spots can distribute heat throughout the ribs and other thermally conductive surfaces to provide the most efficient cooling.

Figure 5:
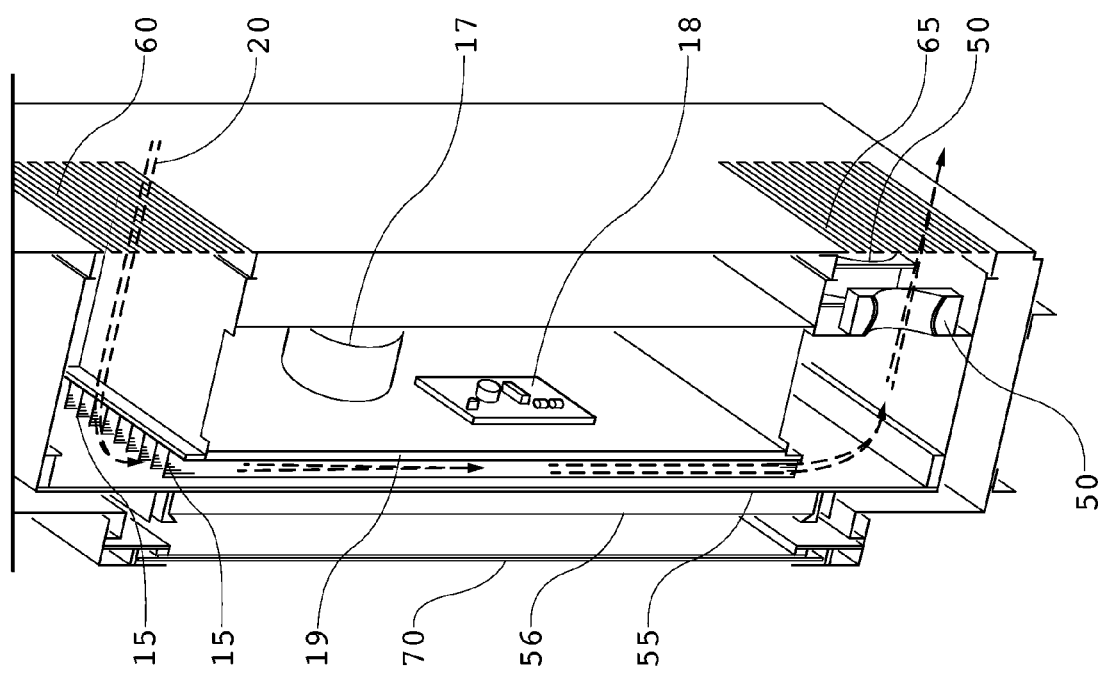
FIG. 5 is a perspective section view of an embodiment showing the inlet and exhaust apertures for the cooling air.

FIG. 5 is a perspective section view of an embodiment showing inlet 60 and exhaust 65 apertures for the cooling air 20. In this embodiment, the ribs 15 are interposed between a front plate 55 and a rear plate 19 where the front 55 and rear 19 plates are substantially parallel to one another. The ribs 15 are preferably in thermal communication with both the front plate 55 and the rear plate 19. Here, a power module 18 and another heat-producing component 17 are placed in thermal communication with the rear plate 19. Preferably, the rear plate 19 is in conductive thermal communication with the power module 18 and heat-producing component 17. As shown in the figure, the footprint of the power module 18 and heat-producing component 17 is substantially smaller than the surface area of the rear plate 19. Although previous heat sinks were limited to the footprint of the component itself, the embodiments herein can provide a much larger surface area and superior cooling capabilities.

In this embodiment, the front plate 55 is in thermal communication with an electronic image assembly 56. Alternatively, the front plate 55 may be the rear surface of the electronic image assembly 56. A front transparent panel 70 may be used to protect the electronic image assembly 56 from damage. Solar loading (radiative heat transfer from the sun through the front transparent panel 70) may result in a heat buildup on the electronic image assembly 56. Thermal communication between the electronic image assembly 56 and the front plate 55 can provide a means for transferring the solar loading (and any other heat buildup) on the electronic image assembly 56 to the ribs 15, cooling air 20, and out of the display through the exhaust aperture 65.

One or more fans 50 may be used to draw the air 20 into the inlet aperture 60 and through the ribs 15. While in this embodiment the fans 50 are placed adjacent to the exhaust aperture 65, in alternative embodiments the fans 50 may be placed adjacent to the inlet aperture 60, or adjacent to both the inlet 60 and exhaust 65 apertures. In some embodiments, the air 20 may be air conditioned (or otherwise cooled) before it is directed along the ribs 15. In some embodiments, the inlet aperture 60 contains a filter in order to remove particulate. The electronic image assembly 56 can be any one of the following: LCD, OLED assembly, plasma display assembly, light emitting polymer (LEP) assembly, organic electro luminescence (OEL) assembly, or LED display assembly.

Figure 6:
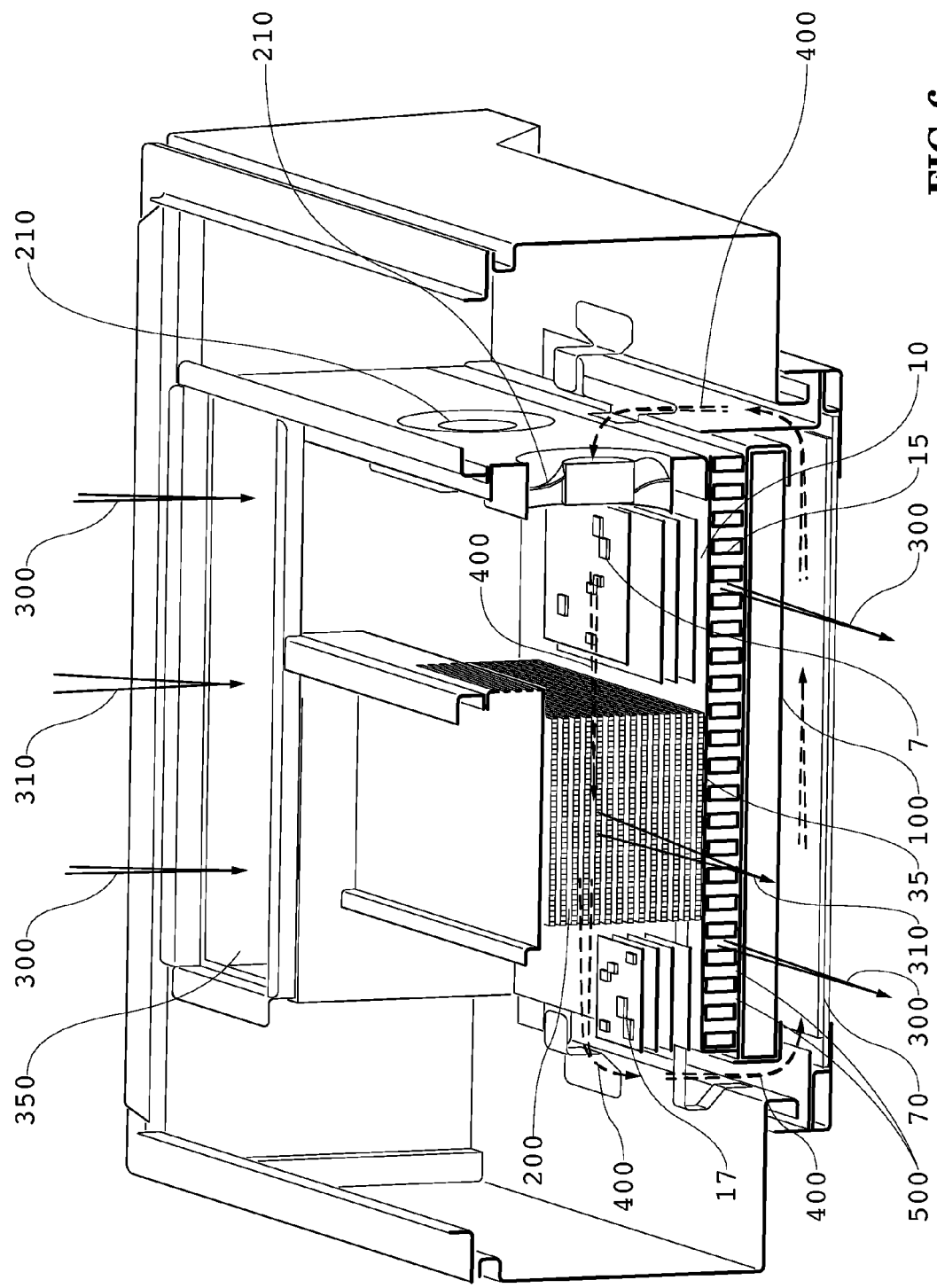
FIG. 6 is a perspective section view of an embodiment using an open loop of cooling air along with a closed loop of cooling air.

FIG. 6 shows an exemplary embodiment using a closed loop of circulating gas 400 which passes through a channel defined between a front protective transparent plate 70 and an electronic image assembly 100. The closed loop of circulating gas 400 may be used to remove heat which has accumulated on the front portion of the electronic image assembly 100 due to solar loading or high ambient temperatures. The circulating gas 400 is preferably forced (or pulled) through a heat exchanger 200 by using one or more fans 210. Thus, the first pathway of the heat exchanger 200 and the channel defined between the front protective transparent plate 70 and the electronic image assembly 100 are in gaseous communication (i.e. allow circulating gas 400 to circulate). Preferably, the heat exchanger 200 contains at least two gas pathways. The first gas pathway accepts the circulating gas 400 while the second gas pathway accepts cooling air 310. In this embodiment, the heat exchanger 200 accepts circulating gas 400 in one direction while accepting open loop cooling air 310 in a substantially perpendicular direction. Heat which has been absorbed by circulating gas 400 is transferred to the open loop cooling air 310 through the heat exchanger 200 and then exhausted out of the display.

Air inlet aperture 350 accepts open loop cooling air 310 and 300. While open loop cooling air 310 is directed through the heat exchanger 200, open loop cooling air 300 is directed along the ribs 15. In a similar arrangement as the ones described above, the ribs 15 are preferably in thermal communication with a thermally conductive plate 10 (which may be in thermal communication with one or more power modules 7 as well as any other heat-producing component 17). Optionally, the ribs 15 may also be in thermal communication with the rear surface 500 of an electronic image assembly 100. In an exemplary embodiment, the rear surface 500 would be the rear surface of a LED backlight for a LCD. In an alternative embodiment, the rear surface 500 would be the rear surface of an OLED assembly.

In a preferred embodiment, the heat exchanger 200 would be a cross-flow heat exchanger. However, many types of heat exchangers are known and can be used with any of the embodiments herein. The heat exchanger 200 may be a cross-flow, parallel flow, or counter-flow heat exchanger. In an exemplary embodiment, the heat exchanger 200 would be comprised of a plurality of stacked layers of thin plates. The plates may have a corrugated, honeycomb, or tubular design, where a plurality of channels/pathways/tubes travel down the plate length-wise. The plates may be stacked such that the directions of the pathways are alternated with each adjacent plate, so that each plate's pathways are substantially perpendicular to the pathways of the adjacent plates. Thus, gas may enter the heat exchanger only through plates whose channels or pathways travel parallel to the path of the gas. Because the plates are alternated, the closed loop and ambient gases may travel in plates which are adjacent to one another and heat may be transferred between the two gases without mixing the gases themselves (if the heat exchanger is adequately sealed, which is preferable but not required).

In an alternative design, an open channel may be placed in between a pair of corrugated, honeycomb, or tubular plates. The open channel may travel in a direction which is perpendicular to the pathways of the adjacent plates. This open channel may be created by running two strips of material or tape (esp. very high bond (VHB) tape) between two opposite edges of the plates in a direction that is perpendicular to the direction of the pathways in the adjacent plates. Thus, gas entering the heat exchanger in a first direction may travel through the open channel (parallel to the strips or tape). Gas which is entering in a second direction (substantially perpendicular to the first direction) would travel through the pathways of the adjacent plates).

Other types of cross-flow heat exchangers could include a plurality of tubes which contain the first gas and travel perpendicular to the path of the second gas. As the second gas flows over the tubes containing the first gas, heat is exchanged between the two gases. Obviously, there are many types of cross-flow heat exchangers and any type would work with the embodiments herein.

An exemplary heat exchanger may have plates where the sidewalls have a relatively low thermal resistance so that heat can easily be exchanged between the two paths of gas. A number of materials can be used to create the heat exchanger. Preferably, the material used should be corrosion resistant, rot resistant, light weight, and inexpensive. Metals are typically used for heat exchangers because of their high thermal conductivity and would work with these embodiments. However, it has been discovered that plastics and composites can also satisfy the thermal conditions for electronic displays. An exemplary embodiment would utilize polypropylene as the material for constructing the plates for the heat exchanger. It has been found that although polypropylene may seem like a poor thermal conductor, the large amount of surface area relative to the small material thickness, results in an overall thermal resistance that is very low. Thus, an exemplary heat exchanger would be made of plastic and would thus produce a display assembly that is thin and lightweight. Specifically, corrugated plastic may be used for each plate layer.

The cooling system may run continuously. However, if desired, temperature sensing devices may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices.

It is to be understood that the spirit and scope of the disclosed embodiments provides for the cooling of many types of displays. By way of example and not by way of limitation, embodiments may be used in conjunction with any of the following: LCD (all types), light emitting diode (LED), organic light emitting diode (OLED), field emitting display (FED), light emitting polymer (LEP), organic electro luminescence (OEL), and plasma displays. Furthermore, embodiments may be used with displays of other types including those not yet discovered. In particular, it is contemplated that the system may be well suited for use with full color, flat panel OLED displays. Exemplary embodiments may also utilize large (55 inches or more) LED backlit, high definition (1080i or 1080p or greater) liquid crystal displays (LCD). While the embodiments described herein are well suited for outdoor environments, they may also be appropriate for indoor applications (e.g., factory/industrial environments, spas, locker rooms) where thermal stability of the display may be at risk.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed inven-

We claim:

1. A system for cooling components in an electronic display having a direct LED backlight comprising:
   a plate having a front and rear side and spaced apart from a rear surface of the LED backlight to define a channel where the plate is substantially parallel to the LED backlight;
   an electronic component attached the rear side of the plate; and
   a plurality of ribs placed between the rear surface of the LED backlight and the front side of the plate.

2. The cooling system of claim 1 further comprising:
   a fan positioned to draw cooling air along the ribs.

3. The cooling system of claim 1 further comprising:
   an isolated chamber which contains the ribs.

4. The cooling system of claim 2 wherein:
   the ribs are elongate metallic members having lengths parallel to the path of the cooling air.

5. The cooling system of claim 1 wherein:
   the plate provides a gaseous and contaminate barrier between the ribs and the component.

6. The cooling system of claim 1 wherein:
   the ribs are positioned to absorb heat from the plate.

7. The cooling system of claim 1 wherein:
   the ribs have a hollow rectangular cross-section.

8. The cooling system of claim 1 wherein:
   the ribs have an I-beam cross-section.

9. The cooling system of claim 1 wherein:
   the ribs have a honeycomb cross-section.

10. The cooling system of claim 2 further comprising:
    an additional component attached to the plate.

11. The cooling system of claim 1 wherein:
    The component is in conductive thermal communication with the plate.

12. The cooling system of claim 1 wherein:
    the plate and ribs are metallic.

13. The cooling system of claim 1 wherein:
    the component is a power module.

14. The cooling system of claim 1 further comprising:
    an additional plate in thermal communication with the ribs.

15. A system for cooling components in an electronic display having a direct LED backlight comprising:
    a plurality of ribs in conductive thermal communication with a rear surface of the LED backlight;
    a plate attached to the ribs;
    an electronic component separate from the LED backlight attached to the plate and in conductive thermal communication with the ribs; and
    a fan positioned to draw cooling air along the ribs.

16. The cooling system of claim 15 wherein:
    the rear surface of the LED backlight is a metal core printed circuit board.

17. The cooling system of claim 15 wherein:
    the ribs are metallic.

18. The cooling system of claim 15 wherein:
    the ribs and plate are in conductive thermal communication with each other.

19. A system for cooling components in an electronic display having a direct LED backlight comprising:
    a plurality of ribs in conductive thermal communication with a rear surface of the LED backlight;
    a plate attached to and in conductive thermal communication with the ribs;
    an electronic component separate from the LED backlight attached to the plate and in conductive thermal communication with the ribs; and
    a fan positioned to draw cooling air along the ribs,
    wherein the plate prevents cooling air from contacting the electronic component.

20. The cooling system of claim 19 wherein:
    the plate and ribs are metallic.

* * * * *